United States Patent
Asplund et al.

(10) Patent No.: US 6,278,314 B1
(45) Date of Patent: Aug. 21, 2001

(54) ELECTRIC CIRCUIT

(75) Inventors: Gunnar Asplund; Bo Danielsson, both of Ludvika; Willy Hermansson, Västerås; Peter Lundberg, Västerås; Christer Ovrén, Västerås; Anders Åberg, Västerås, all of (SE)

(73) Assignee: ABB Research Ltd., Zurich (CH)

( * ) Notice: Subject to any disclaimer, the term of this patent is extended or adjusted under 35 U.S.C. 154(b) by 0 days.

(21) Appl. No.: 09/206,969

(22) Filed: Dec. 8, 1998

(51) Int. Cl.[7] .................................................. H03K 17/08
(52) U.S. Cl. ................................. 327/427; 435/436
(58) Field of Search ................................ 327/427, 430, 327/431, 434, 435, 436, 470, 473, 505; 361/92.1, 91.5; 363/37, 132

(56) References Cited

U.S. PATENT DOCUMENTS

| | | | |
|---|---|---|---|
| 5,262,932 | * | 11/1993 | Stanley et al. .......................... 363/26 |
| 5,734,258 | * | 3/1998 | Esser .................................... 323/224 |
| 5,841,644 | * | 11/1998 | Lipo et al. .............................. 363/37 |
| 5,990,724 | * | 11/1999 | Bijlenga et al. ...................... 327/440 |

FOREIGN PATENT DOCUMENTS

| | | |
|---|---|---|
| 0 670 603 | 9/1995 | (EP) . |
| 7409160-4 | 10/1976 | (SE) . |
| WO 97/01209 | 1/1997 | (WO) . |

* cited by examiner

*Primary Examiner*—Tuan T. Lam
(74) *Attorney, Agent, or Firm*—Connolly Bove Lodge & Hutz

(57) ABSTRACT

An electric circuit comprises a plurality of high power switching services connected in series and adapted to be controlled to be all conducting or blocking substantially simultaneously act together as a single switch and each holding a part of a high voltage to be held by the switch in the blocking state of the switching devices. Each switching device has an avalanche diode of SiC connected in antiparallel therewith and adapted to start to conduct current when reverse biased as of a predetermined voltage limit for preventing that the voltage across the respective switching device exceeds such limit.

10 Claims, 1 Drawing Sheet

ELECTRIC CIRCUIT

TECHNICAL FIELD

The present invention relates to an electric circuit comprising a plurality of high power switching devices connected in series and means adapted to control them to be all conducting or blocking substantially simultaneously to act together as one single switch and to each hold a part of a high voltage to be held by the switch in the blocking state of the switching devices. Each switching device has a rectifying element connected in anti-parallel therewith.

BACKGROUND OF THE INVENTION

Such electric circuits are for example used in different types of converters, rectifiers and inverters, in which high voltages are to be handled. The use of such an electric circuit in a converter in a station for converting direct voltage into alternating voltage may be mentioned as a non-limitative example.

The property in common to all these applications is that the voltages to be held in the blocking state of the single switch are too high to be held by one single switching device, so that a plurality of such devices has to be connected in series for distributing the voltage to be held by the switch thereamong. The voltage to be held may for instance be 30–500 kV, and each switching device may for example alone only hold 1–10 kV. The problem is that it is not possible to manufacture switching devices so that they have exactly the same properties, i.e. reacts exactly the same in every single instant. This means that an over-voltage, i.e. a voltage being higher than the average voltage to be held by the switching devices, may easily occur for an individual switching device during switching due to differences in turn-on delay times, turn-off delay times, tail currents and reverse recovery charges of opposite diodes in a phase leg of a voltage source converter in the case that the single switch forms a current valve of such a converter. It is essential to protect the different switching devices against such overvoltages, since they may destroy the device and possibly result in a drop out of a larger unit, such as a converter station with an interruption of the operation thereof being very costly as a consequence.

It is not a realistic solution to this problem to arrange that many switching devices in series in such a switch without additional surrounding components that the over-voltages will always be within an acceptable limit, but it is a desire to keep the number of switching devices in such a single switch as low as possible for saving costs for the equipment for controlling the switching devices, cooling them and so on. It has therefore been necessary to design the means for controlling the switching devices so that over-voltages occurring will be kept within an acceptable area with respect to magnitude and duration, so that they will not be harmful to the switching devices. This normally means that each individual switching device has to be provided with a separate control member and the control of the single switch has been made very complex and intelligent gate drive circuitry limiting the voltage-time gradient has been utilized in order to control the quotient for each individual switching device. This means that the cost of those electric circuits already known is comparatively high. Another problem always existing in such electric circuits is that the power losses in different components are higher than desired.

SUMMARY OF THE INVENTION

The object of the present invention is to provide an electric circuit of the type defined in the introduction, which solves the problems discussed above to a large extent.

The object according to the invention is achieved by providing such an electric circuit with an avalanche diode as the rectifying element adapted to start to conduct current when reverse biased as of a predetermined voltage limit for preventing that the voltage across the respective switching device from exceeding the limit. The avalanche diode is made of SiC. By producing such a diode of SiC, this may be given the properties required for being connected in anti-parallel with a high power switching device as an over-voltage protection. Accordingly, some superior properties of SiC with respect to, for example, Si are then used, since that SiC has a much higher breakdown voltage than Si and since an avalanche diode in SiC may therefore be made much thinner, which means considerably lower power losses. Such a diode of SiC may also withstand very high temperatures. This means that an avalanche diode may take a much higher current during a certain period of time than, for instance, Si when the voltage across the switching device, reaches a predetermined voltage limit. This way of obtaining an over-voltage suppression utilizing an avalanche diode connected in anti-parallel with the switching device and acting as a voltage clamp constitutes a very simple solution to the problems of over-voltages mentioned above. This means that the control of the switching devices is no longer that delicate and the means for this control may be simplified. Snubbers may also be very much simplified. This means, on one hand, that the costs of the entire electric circuit with control equipment will be considerably reduced, the reliability of the operation of the circuit will also be increased, and the risks of operation interruptions of a plant or the like including such a circuit will be reduced.

According to a preferred embodiment of the invention the avalanche diode has a predetermined voltage limit at a level being higher than a normal voltage to be held by the respective switching device at normal operation of the circuit and when the voltage to be held by a single switch is substantially equally distributed among the switching devices thereof, and a predetermined voltage is preferably at least 30% higher than the normal voltage. Accordingly, when the voltage over the single switch is equally distributed among the switching devices, no avalanche diode will be conducting, but the diodes are there for all the switching devices to prevent any of them from receiving a current exceeding the normal voltage by more than 30% at any time, that it is not so critical to control the different switching devices through complicated circuits for detecting different function parameters of the devices. It is advantageous that there is a considerable difference between the predetermined voltage limit and the normal voltage, so that the avalanche diode will not be conducting except when an abnormal condition prevails at a specific switching device, since the avalanche diode may otherwise be forced to conduct at too high a current during too long a time and, by that, be destroyed.

According to another preferred embodiment of the invention, the avalanche diode has a predetermined voltage limit at a level below a second voltage limit, exceeding which may be harmful to the respective switching device, and the level of a predetermined voltage limit is preferably at least 10% below the second voltage limit. This ensures that there will never be a voltage across any switching device to completely or partially destroy the device.

According to another preferred embodiment of the invention, the switching devices are IGBT's. IGBT's are preferred as switching devices in such an electric circuit, since they may very easily be turned on and off simultaneously, but the problems to be solved by the present invention are also there for such switching devices. According to another preferred embodiment of the invention the switching devices are MOSFET's. However, it is emphasized that the present invention covers electric circuits of the type defined in the introduction in which the switching devices may be of any type of power semiconductor component of turn-on and or turn-off type.

According to another preferred embodiment of the invention, the circuit is a converter circuit, the single switch forms a current valve thereof, and a free-wheeling diode is connected in anti-parallel with each switching device of the valve. This is a preferred application of the present invention.

According to another preferred embodiment of the invention, the free-wheeling diode in anti-parallel with the respective switching device is formed by the avalanche diode. If the forward conducting characteristics of the avalanche diode are close to that of a conventional rectifying diode, and the costs for manufacturing it is not too high, then this constitutes a preferred solution in which the control of the converter is simplified to a large extent by only replacing one component in each switching device, i.e. the diode by another component, the avalanche diode.

According to another preferred embodiment of the invention, an avalanche diode and a separate free-wheeling diode are connected in parallel with each other and in anti-parallel with the respective switching device. This means that the avalanche diode does not have as good forward conducting characteristics as a normal free-wheeling diode, but the task of this branch parallel to the respective switching device will be fulfilled.

According to another preferred embodiment of the invention, the switching devices are gate controlled semiconductor elements, and the controlling means includes a separate gate drive unit for each element for individually controlling the switching devices. These individual gate drive units may be controlled in a much simpler way due to the arrangement of the avalanche diodes of SiC.

Further advantages and advantageous features of the invention will appear from the following description.

BRIEF DESCRIPTION OF THE DRAWING

With reference to the appended drawings, below follows a specific description of preferred embodiments of the invention cited as examples.

In the drawing.

DETAILED DESCRIPTION OF PREFERRED EMBODIMENTS

Figure 1:
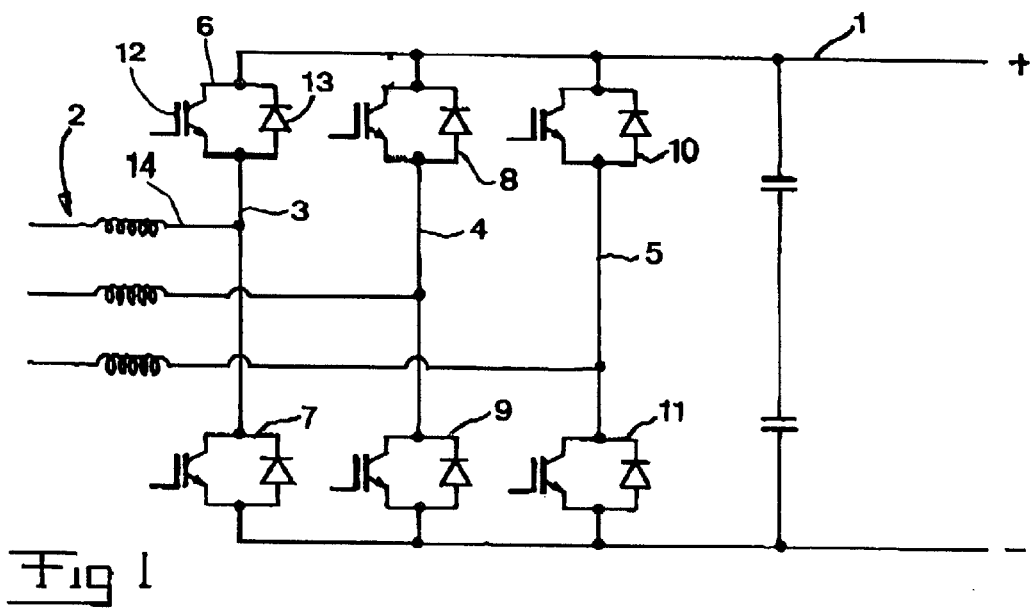
FIG. 1 is a diagram illustrating a converter, in which an electric circuit according to the invention may be arranged.

FIG. 1 illustrates schematically the structure of a VSC-converter (Voltage Source Converter) connected between a direct voltage network 1 for High Voltage Direct Current (HVDC) and a three phase alternating voltage network 2. This constitutes one possible application of an electric circuit according to the present invention. The general structure of such a converter is well known, but it will be briefly explained here for better understanding the problems solved by the present invention. Each phase leg 3–5 of the converter has two so-called current valves 6–11, which are identical to the single switch discussed above and consist of units of switching devices 12 of turn-on and turn-off type connected in series, preferably in the form of IGBT's, and rectifying elements connected in anti-parallel therewith, i.e. elements being conducting in one direction and blocking in the opposite direction, in the form of free-wheeling diodes 13. A large number of such units and through those units IGBT's may be connected in series to function as a single valve disposed to be either turned on and turned off simultaneously, whereby the voltage across the valve is distributed among the different IGBT's connected in series. However, these units are shown in FIG. 1 for the sake of clarity summarized through the symbol of a single unit. The control of the switching devices takes place through pulse width modulation (PWM). The converter is formed by a 6-pulse bridge. If the phase 14 and the switching devices 12 belonging to the current valve 6 are turned on and a current flows from the direct voltage network 1 through these switching devices to the alternating voltage network, a turning-off of the switching devices of this valve will cause the current to continue to flow to the phase 14 from the direct voltage network, and also through the free-wheeling diodes of the valve 7. This is a conventional technique, and the advantage of the present invention will now be described with reference to FIGS. 2 and 3.

Figure 2:
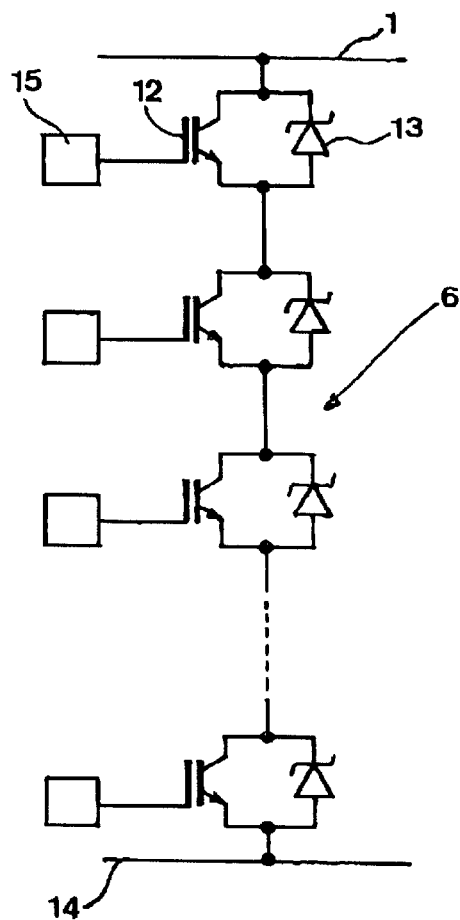
FIG. 2 is a simplified diagram illustrating an electric circuit according to a first preferred embodiment of the invention.

FIG. 2 illustrates how a valve, for example the valve 6 of FIG. 1, is, in practice, is formed by a large number of switching devices 12 connected in series and a rectifying element 13 connected in anti-parallel with each of these devices. Furthermore, a separate gate drive unit 15 is connected to the gate of each switching device for individually controlling the operation thereof, i.e. the turn-on and turn-off procedure. These are all preferably connected to a main control apparatus not shown of the converter station. Avalanche diodes 13 are connected in anti-parallel with the switching devices as the rectifying elements, and these diodes are made of SiC. This means that they may be made very thin and still be able to hold a sufficiently high voltage when reverse biased. Furthermore, the reverse recovery charge thereof will be small and, by that, the power losses will also be much smaller than for diodes of Si. The respective avalanche diode 13 will, in the blocking state of the switching device connected in anti-parallel therewith, start to conduct a current therethrough when the voltage thereacross reaches a predetermined voltage limit, so that the voltage over the switching device will never exceed this limit. This limit may, for instance, be 1.8 kV if 1.3 kV is the voltage to be held by the respective switching device at normal operation of the valve and when the voltage to be held by the valve is substantially equally distributed among the switching devices thereof. This means that the avalanche diode will seldom start to conduct when reverse biased and this voltage limit is selected so that the length of the time of conduction will be shorter than the rated time limit allowed for the conduction of a current resulting from this voltage without any risk of partially or entirely destroying the diode. This time length may for example be 2–3 μs. Furthermore, the voltage limit is so selected that the switching device may never be harmed thereby, and, in the present example the limit for the voltage acceptable to the switching device may be 2.2 kV.

An over-voltage suppression of this type makes it possible to do without any complex gate drive control and dV/dt limiting snubbers for controlling the dV/dt of each individual switching device. Accordingly, the costs of the converter with control equipment may be considerably lower without any loss of safety and operational reliability thereof, at the same time as power losses in the diodes may be reduced with respect to the use of conventional free-wheeling diodes.

Figure 3:
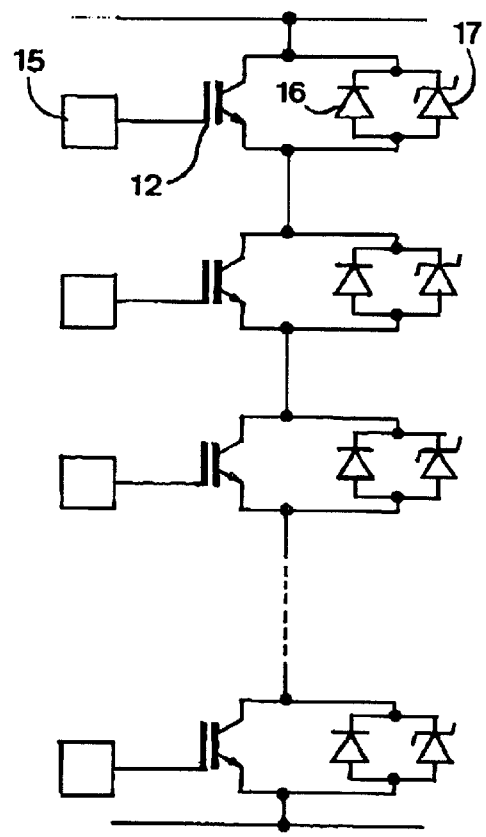
FIG. 3 is a view corresponding to FIG. 2 of an electric circuit according to a second preferred embodiment of the invention.

A current valve according to a second preferred embodiment of the invention is shown in FIG. 3, and this differs from that of FIG. 2 by the fact that a normal rectifying diode 16 acting as a free-wheeling diode, and an avalanche diode of SiC 17 are connected in parallel with each other and in anti-parallel with each switching device 6. The avalanche diode is here used for the over-voltage protection of the switching device, whereas the diode 16 is used for the better on-state characteristics thereof, so that the avalanche diode may be manufactured without much concern about the on-state characteristics thereof and by that be produced to a lower cost.

The invention is, of course, not in any way restricted to the preferred embodiments described above, but many possibilities to modifications thereof would be apparent to a person of ordinary skill in the art without departing from the basic idea of the invention as set forth in the claims.

What is claimed is:

1. An electric circuit comprising
a plurality of high power switching devices, connected in series and a means to control said switching devices either to be all conducting or blocking substantially simultaneously to act as a single switch, wherein each switching device holds a portion of the high voltage to be held in the blocked state of the device, wherein each switching device has a rectifying element connected in anti-parallel therewith, each said rectifying element being an avalanche diode comprised of SiC, and wherein each said avalanche diode conducts current when reversed biased to a pre-determined voltage limit for preventing voltage across the respective switching device from exceeding said limit.

2. A circuit according to claim 1, wherein said avalanche diode has said predetermined voltage limit at a level being higher than a designated voltage to be held by the respective switching device at normal operation of the circuit and when the voltage to be held by said single switch is substantially equally distributed among the switching devices.

3. A circuit according to claim 2, wherein said determined voltage is at least 30% higher than said designated voltage.

4. A circuit according to claim 1, wherein said avalanche diode has said predetermined voltage limit at a level below a second voltage limit, the exceeding of which may be harmful to the respective switching device.

5. A circuit according to claim 4, wherein the level of said predetermined voltage limit is at least 10% below said second voltage limit.

6. A circuit according to claim 1, wherein said switching devices are IGBT's.

7. A circuit according to claim 1, wherein said switching devices are MOwFET's.

8. A circuit according to claim 1, wherein said switching devices are gate controlled semiconductor elements, and wherein said controlling means comprise a separate gate drive unit for each said element for individually controlling the switching devices.

9. An electric circuit comprising:
a plurality of high power switching devices, connected in series and a means to control said switching devices either to be all conducting or blocking substantially simultaneously to act as a single switch and forming a current valve, wherein each switching device holds a portion of the high voltage to be held in the blocked state of the device, each switching device has a free-wheeling avalanche diode of SiC connected in anti-parallel therewith, each of said free-wheeling avalanche diodes conducts current when reversed biased to a pre-determined voltage limit for preventing voltage across the respective switching device from exceeding said limit, and said circuit is a converter circuit.

10. A circuit according to claim 9, wherein an avalanche diode is connected in parallel with each of said free-wheeling diodes and in anti-parallel with the repective switching device.

* * * * *